United States Patent
Ono et al.

(10) Patent No.: US 7,875,372 B2
(45) Date of Patent: Jan. 25, 2011

(54) PERPENDICULAR MAGNETIC RECORDING MEDIUM AND METHOD OF MANUFACTURING THE SAME

(75) Inventors: Toshinori Ono, Tokyo (JP); Hiroyuki Matsumoto, Kanagawa-ken (JP); Mitsuhiro Shoda, Kanagawa (JP); Hiroshi Kanai, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 324 days.

(21) Appl. No.: 11/985,279

(22) Filed: Nov. 13, 2007

(65) Prior Publication Data

US 2008/0113224 A1    May 15, 2008

(30) Foreign Application Priority Data

Nov. 15, 2006    (JP)    ............... 2006-309368

(51) Int. Cl.
*G11B 5/66* (2006.01)
(52) U.S. Cl. ................................... 428/833.3
(58) Field of Classification Search ........................ None
See application file for complete search history.

(56) References Cited

U.S. PATENT DOCUMENTS

| | | | |
|---|---|---|---|
| 6,303,214 B1 * | 10/2001 | Chour et al. ............ | 428/212 |
| 6,316,062 B1 | 11/2001 | Sakaguchi et al. | |
| 6,998,183 B1 * | 2/2006 | Pirzada et al. ........... | 428/833.3 |
| 7,147,943 B2 | 12/2006 | Ono et al. | |
| 2004/0247945 A1 * | 12/2004 | Chen et al. ............. | 428/694 TS |
| 2006/0083952 A1 | 4/2006 | Endou et al. | |

FOREIGN PATENT DOCUMENTS

JP    04-090125 A    3/1992

* cited by examiner

*Primary Examiner*—Holly Rickman

(57) ABSTRACT

Embodiments of the present invention help to improve corrosion resistance and durability by providing a functional diamond like carbon (DLC) protective layer for a perpendicular magnetic recording medium using a granular magnetic layer. According to one embodiment, when a DLC protective layer that protects a granular magnetic layer of a perpendicular magnetic recording medium is formed using a CVD method, the thickness of a first layer on the granular magnetic layer is set to 7.5 to 25% of the total thickness of the protective layer and a hydrogen content of the first layer is set to 33 to 38%, the thickness of a second layer is set to 50 to 85% of the total thickness of the protective layer and a nitrogen content of the second layer is set to 3 to 7%, and the thickness of a third layer located at the outermost side of the protective layer is set to 7.5 to 25% of the total thickness of the protective layer and a hydrogen content of the third layer is set to 25% or less.

16 Claims, 6 Drawing Sheets

PERPENDICULAR MAGNETIC RECORDING MEDIUM AND METHOD OF MANUFACTURING THE SAME

CROSS-REFERENCE TO RELATED APPLICATION

The instant nonprovisional patent application claims priority to Japanese Patent Application No. 2006-309368 filed Nov. 15, 2006 and which is incorporated by reference in its entirety herein for all purposes.

BACKGROUND OF THE INVENTION

As the importance of magnetic disk drives used as storage devices of a large-sized computer, a workstation, a personal computer, and the like increases every year, such magnetic disk drives have been developed to have a large capacity and a small size. In order to realize such a magnetic disk drive having the large capacity and small size, high density recording is essential. For this reason, products using a perpendicular magnetic recording method are recently being developed for practical use since the high density recording is allowed in the perpendicular magnetic recording method unlike a known longitudinal magnetic recording method. For example, a magnetic recording medium using the perpendicular magnetic recording method has a layer configuration in which an adhesion layer, a soft magnetic layer, an intermediate layer, and a granular magnetic layer are stacked on a glass substrate or a rigid nonmagnetic substrate subjected to Ni—P plating on aluminum. In the case of the longitudinal magnetic recording method, the substrate is heated at a temperature of 200 to 400° C. in order to improve the magnetic properties. However, the magnetic properties of the granular magnetic layer used in the perpendicular magnetic recording method can be improved only below about 100° C.

Conventionally, a magnetic recording medium manufactured by using a film deposition technique based on sputtering is provided with a diamond like carbon (DLC) protective layer in order to protect a magnetic layer from sliding by a magnetic head, and the thickness thereof is 5 nm or less. In addition, in order to reduce friction between a magnetic head and a magnetic recording medium, it is common to coat a perfluoropolyether liquid lubricant on the protective layer.

In general, the DLC protective layer may be obtained by depositing hydrocarbon radicals and hydrocarbon ions on a substrate by a chemical vapor deposition (CVD) method using hydrocarbon gas (for example, refer to Japanese Patent Publication No. 04-090125 "Patent Document 1"). In the case of a known longitudinal magnetic recording medium, since the temperature of a substrate is high as described above, hydrocarbon radicals, of which binding power is low and which have arrived at a surface of the substrate, are desorbed during film deposition using the CVD method and a sputtering effect occurs due to implantation of hydrocarbon ions. Thus, a DLC layer having high binding power can be generated as a protective layer remaining on a magnetic layer. In this case, as disclosed in Japanese Patent Publication No. 2004-152462 ("Patent Document 2"), the DLC protective layer has a hydrogen content of about 35% or less, and it is considerably preferable to reduce the hydrogen content in order to improve the flying ability of a magnetic head. Further, Japanese Patent Publication No. 2004-095163 ("Patent Document 3") discloses a technique of realizing sufficient durability and making a film thin by using a two-layered carbon protective film including a plasma CVD carbon layer and a sputtered carbon layer.

However, for the perpendicular magnetic recording medium using the granular magnetic layer described above, hydrocarbon radicals are not easily desorbed since the temperature of a substrate is as low as 75° C. or less. In addition, since a DLC film, which cannot function as a protective layer due to poor binding power, or a very soft polymer like carbon (PLC) film is easily generated at the extremely high film deposition speed, it is difficult to protect a magnetic layer from shocks caused by a magnetic head and the corrosion resistance is not good. Furthermore, in this case, since the DLC film or the PLC film has a hydrogen content of 40% or more, the flying ability of the magnetic head also deteriorates.

In order to solve the above problems, Japanese Patent Publication No. 2006-114182 ("Patent Document 4") discloses a technique of forming a satisfactory DLC film, which is excellent in sliding and corrosion resistance, using an effect of drawing hydrogen from a substrate reaction surface by mixing a hydrocarbon gas with a hydrogen gas and applying a bias voltage to a substrate.

A perpendicular magnetic recording medium disclosed in Patent Document 4 has a satisfactory DLC film excellent in sliding and corrosion resistance as a protective layer; however, since a Co-based alloy used for a recording layer of the perpendicular magnetic recording medium is susceptible to corrosion, it becomes difficult to obtain a result satisfying the product performance from the point of view of corrosion resistance and durability if the protective layer is made thinner in order to improve the recording density.

BRIEF SUMMARY OF THE INVENTION

Embodiments of the present invention help to improve corrosion resistance and durability by providing a functional DLC protective layer for a perpendicular magnetic recording medium using a granular magnetic layer. According to the embodiment shown in FIG. 1, when a DLC protective layer 7 that protects a granular magnetic layer 6 of a perpendicular magnetic recording medium is formed using a CVD method, the thickness of a first layer 7a on the granular magnetic layer is set to 7.5 to 25% of the total thickness of the protective layer and a hydrogen content of the first layer 7a is set to 33 to 38%, the thickness of a second layer 7b is set to 50 to 85% of the total thickness of the protective layer and a nitrogen content of the second layer 7b is set to 3 to 7%, and the thickness of a third layer located at the outermost side of the protective layer is set to 7.5 to 25% of the total thickness of the protective layer and a hydrogen content of the third layer is set to 25% or less.

DETAILED DESCRIPTION OF THE INVENTION

Figure 1:
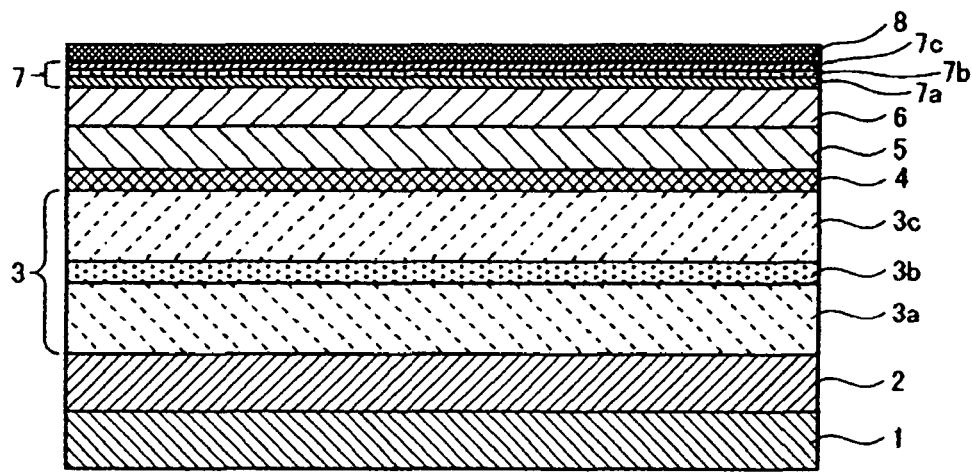
FIG. 1 is a cross-sectional view schematically illustrating a perpendicular magnetic recording medium according to an embodiment of the invention.

Embodiments of the present invention relate to a magnetic recording medium, and more particularly, to a perpendicular magnetic recording medium in which high density magnetic recording is allowed and a method of manufacturing the same.

Embodiments of the invention have been made in view of the drawbacks as described above, and it is an object of embodiments of the invention to improve corrosion resistance and durability by providing a functional DLC protective layer for a perpendicular magnetic recording medium using a granular magnetic layer.

In addition, it is another object of embodiments of the invention to provide a method of manufacturing a perpendicular magnetic recording medium excellent in corrosion resistance and durability.

In order to achieve some or all of the above objects, according to an aspect of embodiments of the invention, a perpendicular magnetic recording medium includes at least an adhesion layer, a soft magnetic layer, a granular magnetic layer, and a protective layer formed above a substrate. The protective layer includes three diamond like carbon (DLC) layers each of which contains carbon as a main component, and hydrogen. The thickness of a first layer of the protective layer is 7.5 to 25% of the total thickness of the protective layer and a hydrogen content of the first layer is 33 to 38%. The thickness of a second layer of the protective layer is 50 to 85% of the total thickness of the protective layer, the second layer contains nitrogen, and a nitrogen content of the second layer is 3 to 7%. The thickness of a third layer of the protective layer is 7.5 to 25% of the total thickness of the protective layer and a hydrogen content of the third layer is 25% or less.

In addition, according to another aspect of embodiments of the invention, a method of manufacturing a perpendicular magnetic recording medium includes: forming at least an adhesion layer, a soft magnetic layer, and a granular magnetic layer above a nonmagnetic substrate by sputtering; forming a first protective layer on the granular magnetic layer by a chemical vapor deposition method using mixed gas of hydrocarbon gas and hydrogen gas without applying a bias voltage to the nonmagnetic substrate; applying a negative bias voltage to the nonmagnetic substrate and forming a second protective layer on the first protective layer by the chemical vapor deposition method using mixed gas of hydrocarbon gas, hydrogen gas, and nitrogen gas; and applying a negative bias voltage to the nonmagnetic substrate and forming a third protective layer on the second protective layer by the chemical vapor deposition method using mixed gas of hydrocarbon gas and hydrogen gas.

According to the aspects of embodiments of the invention, it is possible to improve the corrosion resistance and durability in a perpendicular magnetic recording medium using a granular magnetic layer.

Hereafter, embodiments of the invention will be described in detail with reference to the accompanying drawings.

FIG. 1 is a cross-sectional view schematically illustrating a perpendicular magnetic recording medium (magnetic disk) according to an embodiment of the invention. A perpendicular magnetic recording medium (magnetic disk) includes an AlTi adhesion layer 2, a soft magnetic layer 3, an NiW seed layer 4, an Ru intermediate layer 5, a Co-based alloy granular magnetic layer (recording layer) 6, a protective layer 7, and a lubricant layer 8 that are formed on both surfaces of a nonmagnetic substrate (substrate) 1. The soft magnetic layer 3 is a layer obtained by stacking an FeCo-based lower soft magnetic layer 3a, an Ru antiferromagnetic coupling layer 3b, and an FeCo-based upper soft magnetic layer 3c. The protective layer 7 is a layer obtained by stacking a first protective layer 7a, a second protective layer 7b, and a third protective layer 7c.

Since a process to be executed until the recording layer 6 is formed on the nonmagnetic substrate 1 is performed on the basis of a normal manufacturing method to be described below, illustration of a manufacturing apparatus is omitted.

First, a soda lime glass substrate (which has an external diameter of 48 mm, an internal diameter of 12 mm, and a thickness of 0.51 mm) used as the substrate 1 is washed. Then, the substrate 1 is introduced into a vacuum chamber evacuated up to about $1.3 \times 10^{-5}$ Pa ($1.0 \times 10^{-7}$ Torr) or less. Then, the substrate 1 is conveyed into a chamber for forming an adhesion layer, where the AlTi adhesion layer 2 containing Al and 50% by atom of Ti is formed to have a thickness of 7 nm under Ar atmosphere of about 0.8 Pa (6 mTorr) using a DC magnetron sputtering method. Subsequently, the substrate 1 is conveyed into a chamber for forming a lower soft magnetic layer, where the FeCo-based lower soft magnetic layer 3a made of an alloy containing Fe, 35% by atom of Co, 9% by atom of Ta, and 4% by atom of Zr is formed to have a thickness of 25 nm under Ar atmosphere of about 0.8 Pa (6 mTorr) using the DC magnetron sputtering method. Then, the substrate 1 is conveyed into a chamber for forming an antiferromagnetic coupling layer, where the Ru layer 3b is formed to have a thickness of 0.5 nm under Ar atmosphere of about 0.8 Pa (6 mTorr) using the DC magnetron sputtering method. Thereafter, the substrate 1 is conveyed into a chamber for forming an upper soft magnetic layer, where the upper soft magnetic layer 3c made of an alloy containing Fe, 35% by atom of Co, 9% by atom of Ta, and 4% by atom of Zr is formed to halve a thickness of 25 nm under Ar atmosphere of about 0.8 Pa (6 mTorr) using the DC magnetron sputtering method. Then, the substrate 1 is conveyed into a substrate cooling chamber in order to lower the temperature of the substrate 1, which has risen due to heat in sputtering, up to 55° C. Then, the substrate 1 is conveyed into a chamber for forming a seed layer, where the seed layer 4 containing Ni and 8% by atom of W is formed to have a thickness of 8 nm under Ar atmosphere of about 0.9 Pa (7 mTorr) using the DC magnetron sputtering method. Then, the substrate 1 is carried into a chamber for forming an intermediate layer, where the Ru intermediate layer 5 is formed to have a thickness of 15 nm under Ar atmosphere of about 2 Pa (15 mTorr) using the DC magnetron sputtering method. Thereafter, the substrate 1 is carried into a chamber for forming a magnetic recording layer, where the granular magnetic layer (recording layer) 6 made of an alloy containing 90 mol % of (Co, 15% by atom of Cr, and 18% by atom of Pt) and 8 mol % of $SiO_2$ is formed to have a thickness of 17 nm under Ar atmosphere of about 0.9 Pa (7 mTorr) using the DC magnetron sputtering method.

As the substrate 1, it is possible to use aluminosilicate that is chemically reinforced, an Al—Mg alloy substrate subjected to Ni—P electroless plating, a nonmagnetic rigid substrate made of silicon, ceramics containing borosilicate glass, or ceramics subjected to glass grazing, in addition to the soda lime glass.

The adhesion layer 2 is provided to prevent electrochemical elution of an alkali metal from a soda lime glass or to improve adhesion between the glass and the soft magnetic layer 3. For this reason, the adhesion layer 2 may be made of NiTa, AlTa, CrTi, CoTi, NiTaZr, NiCrZr, CrTiAl, CrTiTa, CoTiNi, or CoTiAl in addition to AlTi, and the thickness of the adhesion layer 2 may be arbitrarily set. Moreover, the adhesion layer 2 may not be provided if the adhesion layer 2 is not particularly needed.

In addition, a soft magnetic layer backing layer may be provided between the adhesion layer 2 and the soft magnetic layer 3. In this case, a representative configuration is such that a layer made of Ni and 18% by atom of Fe, a layer made of Fe and 50% by atom of Mn, a layer made of Co and 10% by atom of Fe are sequentially formed on the adhesion layer 2 to have thicknesses of 6 nm, 17 mm, and 3 nm, respectively, thereby forming the soft magnetic layer 3.

For the seed layer 4, it is possible to use an NiFe alloy, an NiTa alloy, a TaTi alloy, and the like. In addition, a CrTi alloy may be stacked between the seed layer 4 and the soft magnetic layer 3.

Moreover, the substrate cooling process may be performed not after forming the upper soft magnetic layer 3c but before forming the upper soft magnetic layer 3c or before forming the recording layer 6. Alternatively, the substrate cooling process may be performed a plurality of times.

Figure 2:
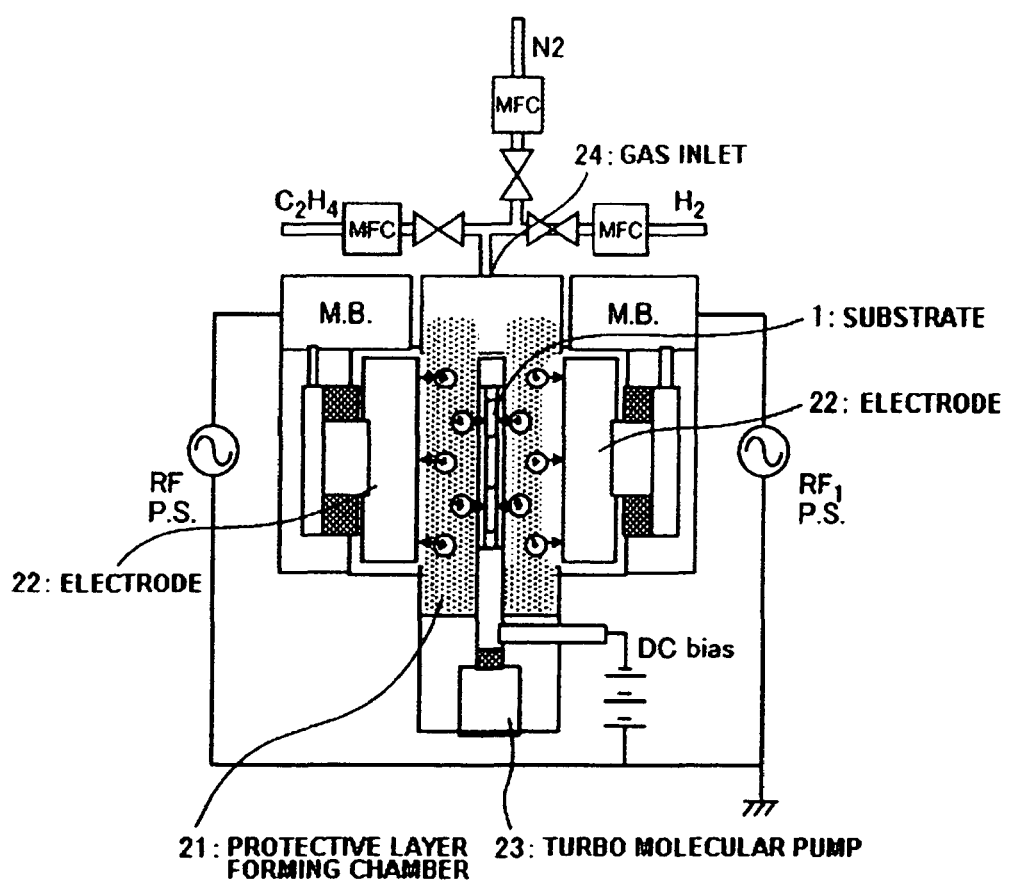
FIG. 2 is a view schematically illustrating a protective layer forming apparatus according to one embodiment.
Figure 3:
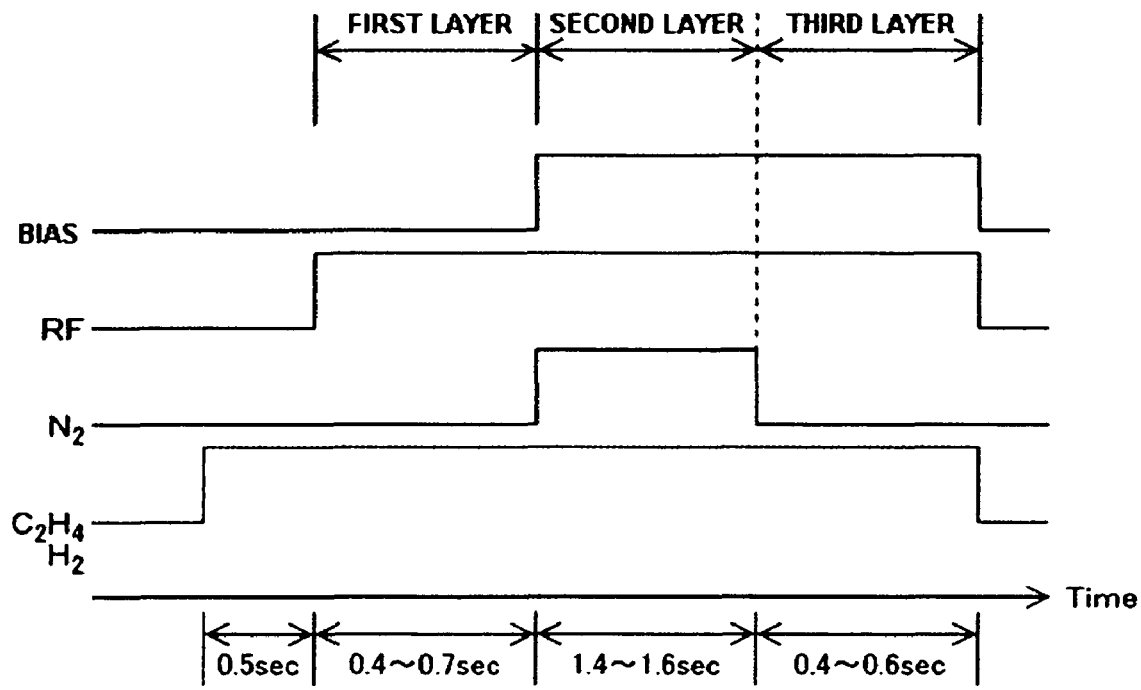
FIG. 3 is a timing chart illustrating gas introduction to a protective layer forming apparatus, RF application, and application of a bias voltage.

On the substrate on which layers up to the recording layer 6 are formed, the DLC protective layer 7 that contains carbon as a main component and further contains hydrogen is formed as will be described below. FIG. 2 is a view schematically illustrating a film deposition apparatus that forms the DLC protective layer 7 on the magnetic layer 6 of a magnetic disk which is a perpendicular magnetic recording medium. FIG. 3 is a timing chart illustrating gas introduction to a protective layer forming apparatus, application of a high-frequency voltage (RF), and application of a bias voltage.

The substrate 1 on which layers up to the recording layer 6 have been stacked is conveyed into a protective layer forming chamber 21 shown in FIG. 2 without taking the substrate 1 out of the vacuum chamber. The protective layer forming chamber 21 has RF electrodes 22 to which a high-frequency voltage is applied from an RF (radio-frequency) power supply (P. S.) corresponding to a frequency of 13.56 MHz through a matching box (M. B.). In addition, these RF electrodes 22 are symmetrically provided on opposite sides with respect to the substrate 1 so that film deposition can be simultaneously performed on both surfaces. FIG. 3 is a timing chart illustrating gas introduction and RF and bias voltage application. While the protective layer forming chamber 21 is evacuated using a turbo molecular pump 23, ethylene ($C_2H_4$) gas is introduced from a gas inlet 24 positioned above the protective layer forming chamber 21 through a mass flow controller (MFC) and hydrogen ($H_2$) gas is simultaneously introduced from the gas inlet 24 through the MFC. In this case, the flow rate of ethylene is set to 100 to 250 sccm (standard cubic centimeter per minute) and the flow rate of hydrogen is set to 100 to 200 sccm. In addition, the flow rate of nitrogen ($N_2$) is set to 50 to 200 sccm and nitrogen addition time and substrate bias voltage application time are changed independently from each other to change the thickness ratio of a first layer 7a, a second layer 7b, and a third layer 7c of the protective layer 7. Thus, several kinds of samples are manufactured. At this time, the pressure of the protective layer forming chamber 21 is 2.5 to 3.0 Pa in a read value of a baratron gauge.

In order to manufacture each sample, the ethylene gas and the hydrogen gas, as described above, are introduced and power of 2000 W is applied to the RF electrode after 0.5 sec from the beginning of the introduction to induce plasma. In the case of applying the substrate bias voltage, a voltage of −250 V is applied by bringing an electrode (not shown), of which an electric potential is a ground potential and which is insulated from the RF electrode 22 and is made of an Ni alloy, into contact with the end surface of the substrate. At this time, a self-bias of the RF electrode 22 is −950 to −1050 V, and a bias current to the substrate side including a substrate holder is 0.35 to 0.90 A in total. By using the RF-CVD and adjusting plasma holding time, the DLC protective layer 7 having the first protective layer 7a, the second protective layer 7b, and the third protective layer 7c is formed on the recording layer 6 (made of Co—Cr—Pt—$SiO_2$) in the total thickness of 4.0 nm. In this case, the first protective layer 7a contains carbon as a main component and further contains hydrogen, the second protective layer 7b contains carbon as a main component and further contains hydrogen and nitrogen, and the third protective layer 7c contains carbon as a main component and further contains hydrogen.

The amount of hydrogen and the amount of nitrogen contained in a film of the sample manufactured by the above-described manufacturing method are measured by the following method. The measurement of the hydrogen content is performed by an HFS (hydrogen forward scattering) using a DSIMS (dynamic secondary ion mass spectroscopy). ADEPT1010 made by ULVAC-PHI, inc. is used as a DSIMS measuring system. In this case, a ratio of 133Cs2+1H and 133Cs+12C is set as H/C under the condition of Cs of 350 V and 20 nA, a measurement area of 700 μm, and an output angle of 80°. An HRBS500, which is made by Kobe Steel, Ltd. and is a high-resolution RBS analysis apparatus, is used for the HFS. In this case, a beam energy is 480 KeV, the type of ion is $N^{2+}$, a scattering angle is 30°, a beam incident angle is 70° with respect to a line normal to a sample, a sample current is about 1.5 nA, a beam exposure amount is about 310 nC, and a measurement energy range is 60 to 95 KeV. Hydrogen ions recoiled by nitrogen ions under the above measurement condition are detected by a magnetic detector. In addition, a known sample in which hydrogen is not contained is used as a background. An XPS (X-ray photoelectron spectroscopy) is used for the determination of the amount of nitrogen. An ESCA analysis apparatus made by ULVAC-PHI, Inc. is used as a measurement apparatus. In this case, AlKα1 is an excitation source, a beam diameter is 200 μm, and an output angle is 24°.

Using a plurality of samples manufactured in the method described above, the fluorocarbon-based lubricant layer 8 is provided on the DLC protective layer 7. The thickness is determined using a Fourier transform infrared (FT-IR) spectroscopy and is set to 1.2 nm for all the samples. Using a plurality of magnetic disks provided with the fluorocarbon-based lubricant layer 8, evaluation regarding corrosion resistance and reliability is performed as will be described below.

Figure 4:
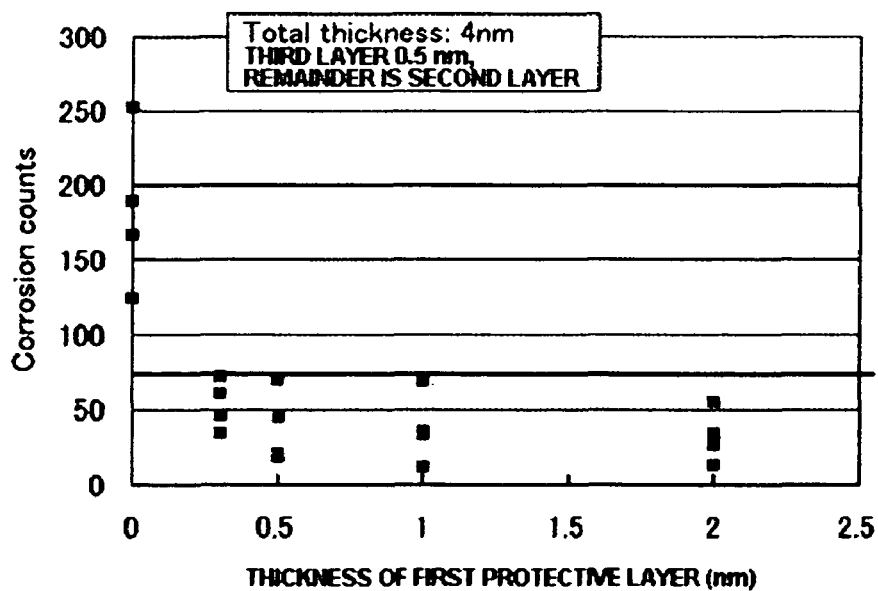
FIG. 4 is a view illustrating how the corrosion resistance depends on the thickness of a first protective layer.

The corrosion resistance of the magnetic disks is evaluated under the following condition. That is, the magnetic disks are placed for four days in a temperature and relative humidity environmental tub whose temperature is 60° C. and relative humidity is 95%. After four days, the magnetic disks are taken out from the temperature and relative humidity environmental bath. Then, corroded spots of a magnetic disk surface are counted by Corrosion Analysis measurement of the Optical Surface Analyzer Model 21 made by Candela Instrument, Inc. It is experientially known that sufficient corrosion resistance necessary for a magnetic disk used in a hard disk drive can be obtained if the number of corroded spots created in the test is equal to or smaller than 75. A result of the evaluation is shown in FIG. 4. In FIG. 4, a horizontal axis indicates the thickness of the first protective layer 7a and a vertical axis indicates the number of corroded spots. The total thickness of the protective layer 7 is 4.0 nm and a part excluding the first protective layer 7a is configured to include the third protective layer 7c having a thickness of 0.5 nm and the second protective layer 7b having a remaining thickness. That is, in the case of the corrosion resistance, a satisfactory result is obtained particularly when the thickness of the first layer of the protective layer 7 is in a range equal to or larger than 0.3 nm.

As evaluation for reliability of the magnetic disk, the strength against a scratch damage is tested and measured. The strength test with respect to the scratch damage will be described below. Alumina grains having an average diameter of 0.2 μm are sprayed into a magnetic disk drive having a magnetic disk and a magnetic head mounted therein, and the magnetic head is swept on a disk for 5 minutes. At this time, the flying height of the magnetic head is 10 nm, a head sweep frequency is 1 Hz, and the number of rotations of the magnetic disk is 4200/min. In addition, alumina grains weighed about 3 μg are supplied into a sprayer and then the alumina grains are sprayed from about 10 cm above a surface of the magnetic disk mounted in the magnetic disk drive. Thereafter, white light is incident on the disk surface from an angle of 45°, and light scattered from the disk surface is position-resolved by using a CCD, followed by image-processing. Thus, scratches corresponding to a predetermined threshold value or more are counted. It is experientially known that a sufficient proof strength necessary for a disk used in a magnetic disk drive can be obtained if the number of scratches is equal to or smaller than approximately 10,000.

Figure 5:
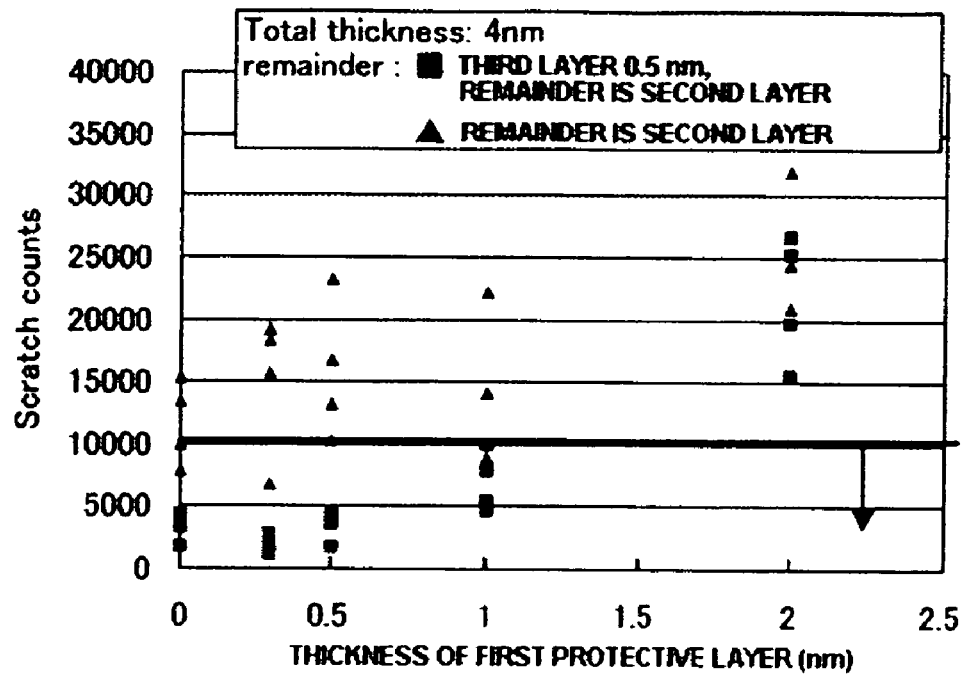
FIG. 5 is a view illustrating how the scratch strength depends on the thickness of the first protective layer.

A result of the evaluation is shown in FIG. 5. In FIG. 5, a horizontal axis indicates the thickness of the first layer and a horizontal axis indicates the number of scratches. The total thickness of the protective layer 7 is 4.0 nm. In addition, in the case of a legend rectangle, a part excluding the first layer is configured to include the third protective layer having a thickness of 0.5 nm and the second layer having a remaining thickness. In addition, in the case of the legend triangle, a part excluding the first layer is configured to include the second layer. That is, in the case of the number of scratches, a satisfactory result is obtained when the second layer and the third layer are provided and the first layer has a thickness of 1 nm or less.

Figure 6:
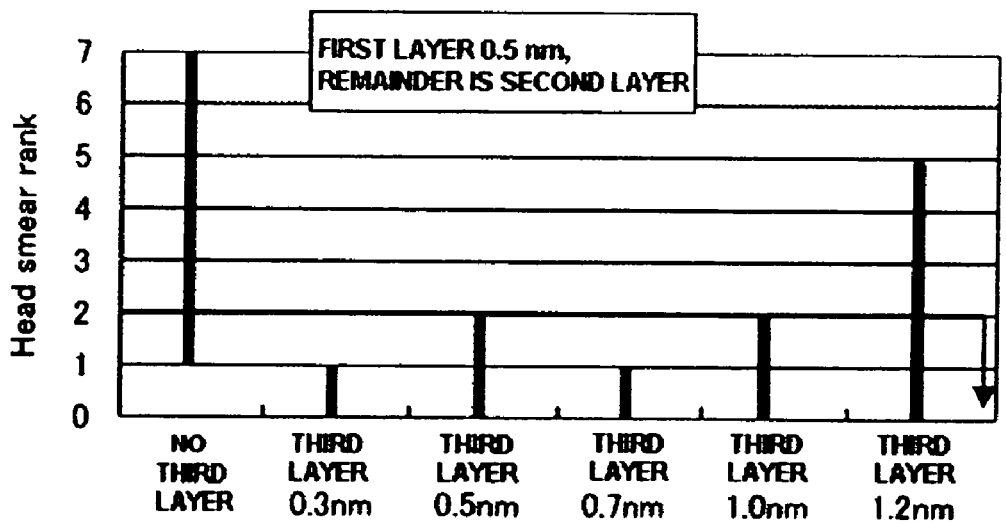
FIG. 6 is view illustrating how the head smear depends on the thickness of a third protective layer.

Next, evaluation on head smearing is performed as the reliability evaluation. In the head smearing evaluation, a magnetic head flies above a magnetic disk that is rotating, the magnetic head gradually moves by 0.05 mm from the radius position of 12 mm of the magnetic disk to the radius position of 22.5 mm and is then removed, and an air bearing surface of the magnetic head is observed using a microscope. Thus, contamination of the magnetic head is evaluated. In this test, the flying height of the head is 8 nm. The result is shown in FIG. 6. An evaluation result is classified into ranks 1 to 7 according to a contamination condition on the assumption that a state where there is no contamination is a rank 0. For a disk in which head contamination does not occur in this test, it can be determined that lubricant on a protective layer is maintained uniformly and sufficiently by chemical bonding. On the other hand, a disk in which the head contamination occurs much means the opposite. In the case of a disk used in a magnetic disk drive, it is experimentally known that the head smear of rank 2 or less is a threshold value for stably performing read/write of the magnetic head. That is, referring to FIG. 6, when an outermost layer is a second layer, the head smear reaches the rank 7. In contrast, in the configuration according to the embodiment described above, a satisfactory result corresponding to head smear of rank 2 or less is obtained by setting the thickness of the third layer of the protective layer 7 to 0.3 to 1.0 nm.

Among the samples used in the test described above, for a sample having a first layer with a thickness of 0.5 nm, a second layer with a thickness of 2.8 nm, and a third layer with a thickness of 0.7 nm, hydrogen content and nitrogen content of each of the layers are measured. As a result, the hydrogen content of the first layer, the hydrogen content of the second layer, the nitrogen content of the second layer, and the hydrogen content of the third layer are 33%, 22%, 5.5%, and 25%, respectively.

Figure 7:
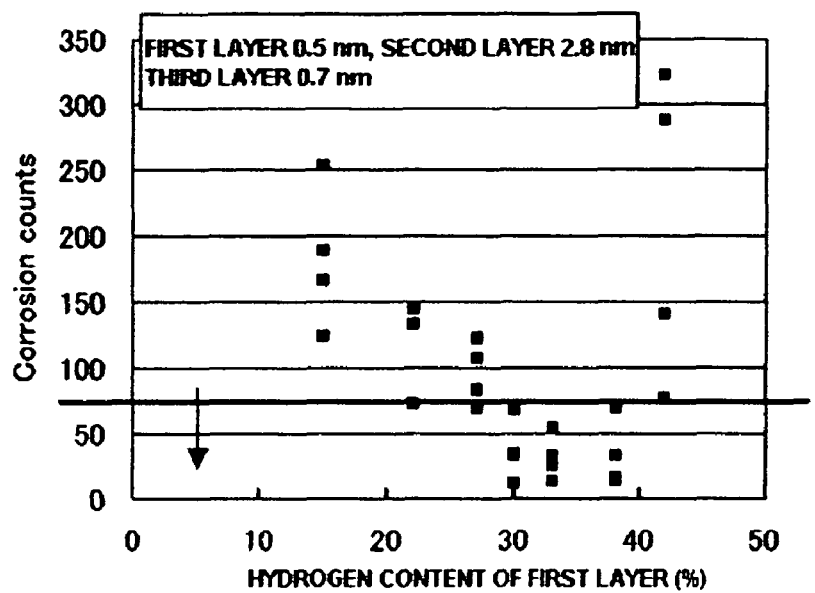
FIG. 7 is a view illustrating how the corrosion resistance depends on the hydrogen content of the first protective layer.

Next, a result of a corrosion resistance test, in which only the hydrogen content of the first layer is changed while maintaining the thicknesses of the first, second, and third layers that form the protective layer as 0.5 nm, 2.8 nm, and 0.7 nm, respectively, is shown in FIG. 7. A method of manufacturing the second and third layers is the same as that for the sample described above. That is, the satisfactory corrosion resistance is obtained when the hydrogen content of the first layer is 33 to 38%. For the strength test on scratch damage and head smear evaluation, a satisfactory result is obtained without depending on the hydrogen content of the first layer, and accordingly, illustration thereof is omitted.

Figure 8:
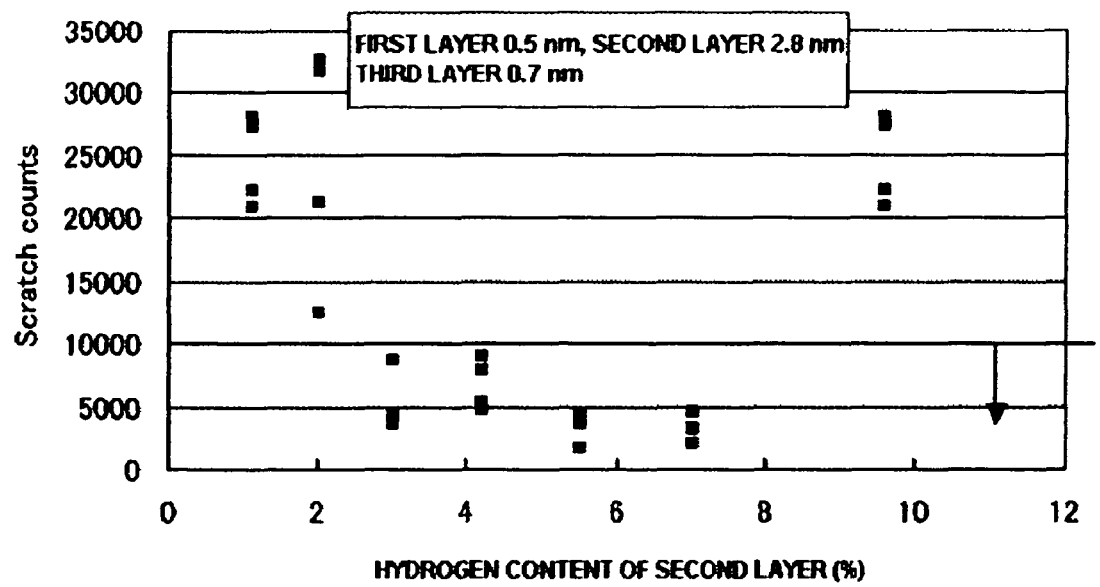
FIG. 8 is a view illustrating how the scratch strength depends on the nitrogen content of a second protective layer.

Next, a result of the strength test on scratch damage, in which only the nitrogen content of the second layer is changed while maintaining the thicknesses of the first, second, and third layers that form the protective layer as 0.5 nm, 2.8 nm, and 0.7 nm, respectively, is shown in FIG. 8. A method of manufacturing the first and third layers is the same as that for the sample described above. That is, it can be seen that a satisfactory proof strength in the scratch strength test is obtained when the nitrogen content of the second layer is 3 to 7%. For the corrosion resistance test and the head smear evaluation, a satisfactory result is obtained without depending on the nitrogen content of the second layer, and accordingly, illustration thereof is omitted.

Figure 9:
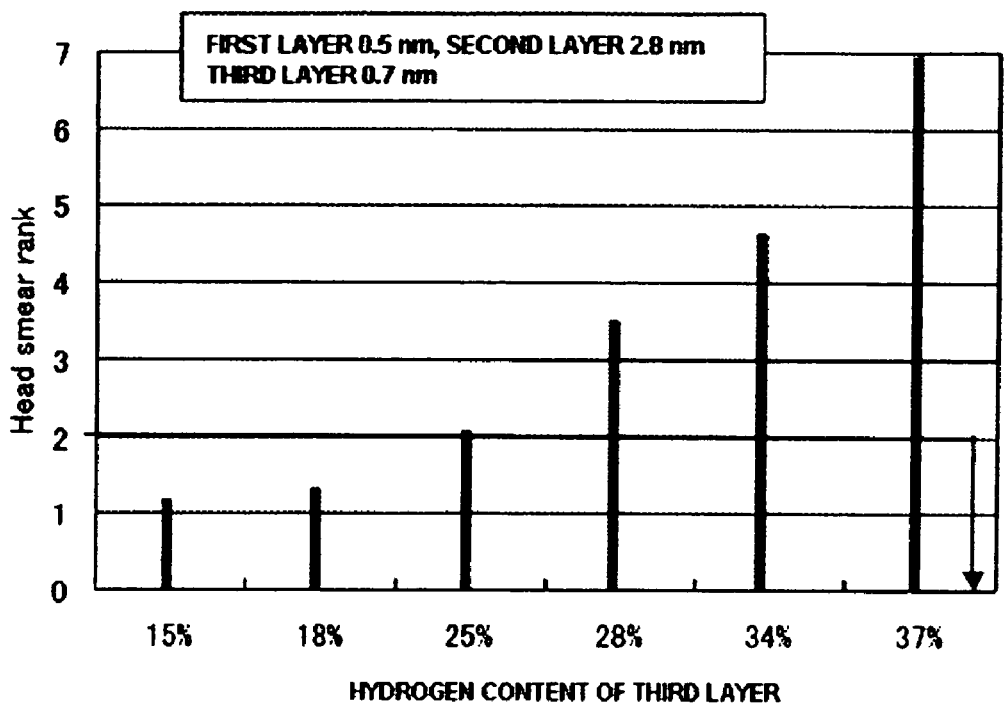
FIG. 9 is view illustrating how the head smear depends on the hydrogen content of the third protective layer.

Next, a result of the head smear evaluation, in which only the hydrogen content of the third layer is changed while maintaining the thicknesses of the first, second, and third layers that form the protective layer as 0.5 nm, 2.8 nm, and 0.7 nm, respectively, is shown in FIG. 9. A method of manufacturing the first and second layers is the same as that for the sample described above. That is, it can be seen that a test result corresponding to head smear of rank 2 or less is obtained when the hydrogen content of the third layer is 25% or less. For the corrosion resistance test and the strength test on scratch damage, a satisfactory result is obtained without depending on the hydrogen content of the third layer, and accordingly, illustration thereof is omitted.

Figure 10:
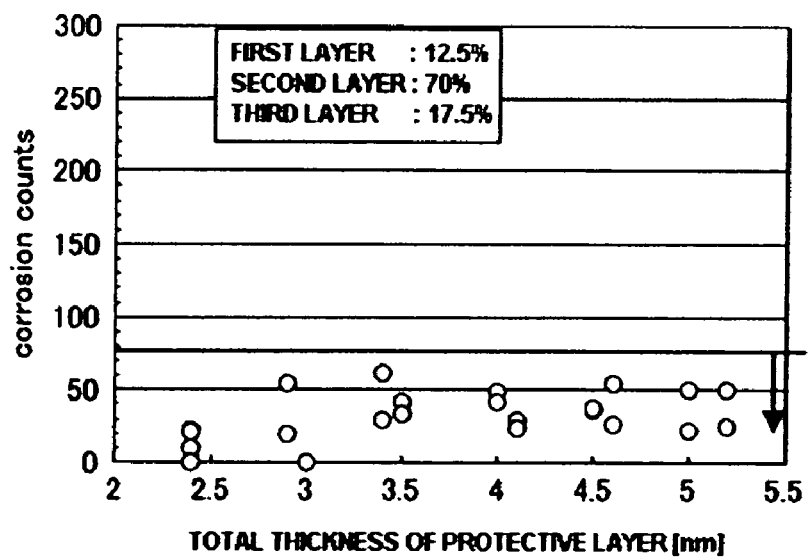
FIG. 10 is a view illustrating the relationship between the total thickness of a protective layer and the corrosion resistance.
Figure 11:
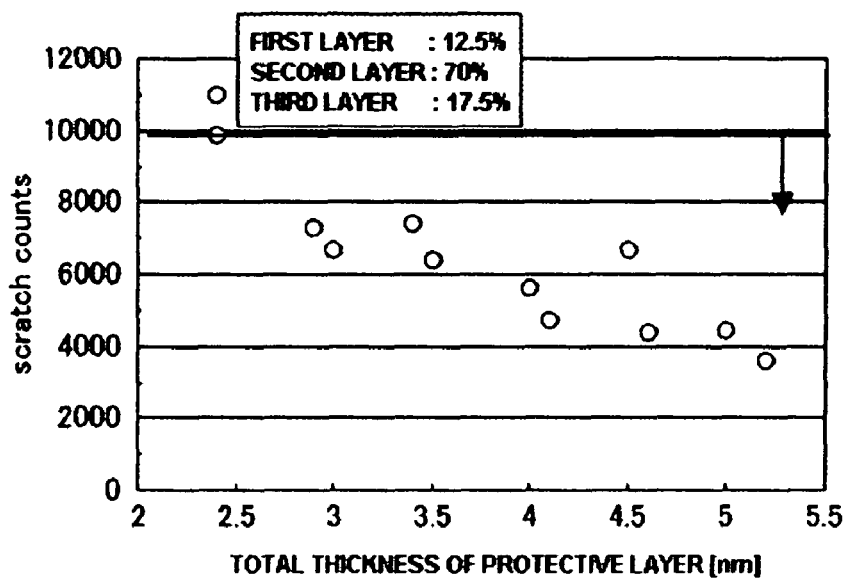
FIG. 11 is a view illustrating the relationship between the total thickness of a protective layer and the scratch resistance.
Figure 12:
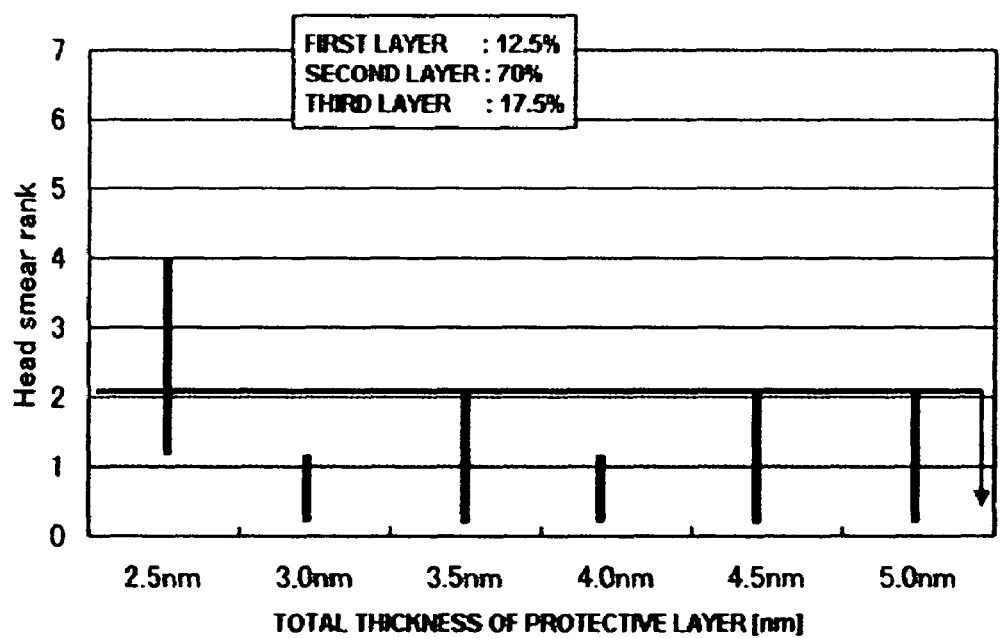
FIG. 12 is a view illustrating the relationship between the total thickness of a protective layer and a head smear rank.

Although the total thickness of the protective layer 7 is set to 4.0 nm in the embodiment described above, the corrosion resistance, scratch resistance, and head smear when the total thickness of the protective layer 7 is changed to 2.5 nm, 3.0 nm, 3.5 nm, 4.0 nm, 4.5 nm, and 5.0 nm are shown in FIGS. 10 to 12. From the results, it can be seen that the same result as in the embodiment described above is obtained if the total thickness of the protective layer 7 is in the range of 3.0 nm to 5.0 nm.

The above result indicates that when three-layer diamond like carbon (DLC) protective layers each of which contains carbon as a main component and further contains hydrogen are formed by means of a chemical vapor deposition (CVD) method using mixed gas of hydrocarbon gas and hydrogen gas, a perpendicular magnetic recording medium excellent in corrosion resistance, durability, and head flying ability can be obtained by setting such that the thickness of the first layer (lower layer) is set to 7.5 to 25% of the total thickness of the protective layer and the hydrogen content of the first layer is set to 33 to 38%, the thickness of the second layer (intermediate layer) is set to 50 to 85% of the total thickness of the protective layer and the second layer further contains nitrogen and the nitrogen content of the second layer is set to 3 to 7%, and the thickness of the third layer (outermost layer) is set to 7.5 to 25% of the total thickness of the protective layer and the hydrogen content of the third layer is set to 25% or less.

The perpendicular magnetic recording medium can be obtained by means of the CVD method using mixed gas of hydrocarbon gas and hydrogen gas. Specifically, the perpendicular magnetic recording medium can be obtained by forming a first DLC layer on a granular magnetic recording layer without applying a bias voltage to a substrate, adding nitrogen gas, applying a negative bias voltage to the substrate to form a second DLC layer, and applying a negative bias voltage to the substrate without adding nitrogen gas so as to form a third DLC layer.

What is claimed is:

1. A perpendicular magnetic recording medium comprising an adhesion layer, a soft magnetic layer, a granular magnetic layer, and a protective layer formed above a substrate,
wherein the protective layer includes three diamond like carbon layers each of which contains carbon as a main component, and hydrogen,
a first layer of the protective layer has a thickness of from 7.5 to 25% of a total thickness of the protective layer and has a hydrogen content of from 33 to 38%,
a second layer of the protective layer formed over the first layer has a thickness of from 50 to 85% of the total thickness of the protective layer and exclusively further contains nitrogen within the protective layer, and a nitrogen content of the second layer is from 3 to 7%, and
a third layer of the protective layer formed over the second layer has a thickness of from 7.5 to 25% of the total thickness of the protective layer and has a hydrogen content of 25% or less.

2. The perpendicular magnetic recording medium according to claim 1, wherein a total thickness of the protective layer is from 3.0 nm to 5.0 nm.

3. The perpendicular magnetic recording medium according to claim 1, wherein the granular magnetic layer is made of Co-based alloy.

4. The perpendicular magnetic recording medium according to claim 3, wherein an Ru intermediate layer is formed between the soft magnetic layer and the granular magnetic layer.

5. The perpendicular magnetic recording medium according to claim 1, wherein a lubricant layer is formed on the protective layer.

6. The perpendicular magnetic recording medium according to claim 1,
wherein the substrate is one selected from a soda lime glass substrate, an aluminosilicate substrate that is chemically reinforced, an Al—Mg alloy substrate subjected to Ni—P electroless plating, and a ceramic substrate,
the adhesion layer is an alloy layer made of one selected from AlTi, NiTa, AlTa, CrTi, CoTi, NiTaZr, NiCrZr, CrTiAl, CrTiTa, CoTiNi, and CoTiAl,
the soft magnetic layer is an FeCo-based alloy layer, and
the granular magnetic layer is made of Co-based alloy.

7. The perpendicular magnetic recording medium according to claim 6, wherein the granular magnetic layer is made of CoCrPt—$SiO_2$ alloy.

8. The perpendicular magnetic recording medium according to claim 6, wherein an Ru intermediate layer is formed between the soft magnetic layer made of FeCo-based alloy and the granular magnetic layer made of Co-based alloy.

9. The perpendicular magnetic recording medium according to claim 8, wherein a seed layer made of one selected from NiW alloy, NiFe alloy, NiTa alloy, and NiTi alloy is formed between the soft magnetic layer made of FeCo-based alloy and the Ru intermediate layer.

10. The perpendicular magnetic recording medium according to claim 6, wherein a soft magnetic layer backing layer obtained by stacking NiFe alloy, FeMn alloy, and CoFe alloy is formed between the adhesion layer and the soft magnetic layer.

11. The perpendicular magnetic recording medium according to claim 6, wherein the soft magnetic layer is formed by stacking a lower soft magnetic layer made of FeCo-based alloy, an Ru antiferromagnetic coupling layer, and an upper soft magnetic layer made of FeCo-based alloy.

12. The perpendicular magnetic recording medium according to claim 1, wherein the first layer has a thickness of about 0.5 nm, the second layer has a thickness of about 2.8 nm, and the third layer has a thickness of about 0.7 nm.

13. The perpendicular magnetic recording medium according to claim 1, wherein a total thickness of the protective layer is about 5.0 nm.

14. A perpendicular magnetic recording medium comprising an adhesion layer, a soft magnetic layer, a granular magnetic layer, and a protective layer formed above a substrate,
wherein the protective layer includes three diamond like carbon layers each of which contains carbon as a main component, and hydrogen,
a first layer of the protective layer has a thickness of about 0.5 nm, a second layer of the protective layer formed over the first layer has a thickness of about 2.8 nm, the second layer exclusively containing nitrogen within the protective layer, and
a third layer of the protective layer formed over the second layer has a thickness of about 0.7 nm.

15. The perpendicular magnetic recording medium according to claim 14, wherein a total thickness of the protective layer is about 5.0 nm.

16. The perpendicular magnetic recording medium according to claim 14, wherein the first layer has a hydrogen content of about 33 to 38%, the second layer contains a nitrogen content of about 3 to 7%, and the third layer has a hydrogen content of about 25% or less.

* * * * *